United States Patent
Reid et al.

(10) Patent No.: US 9,551,058 B2
(45) Date of Patent: Jan. 24, 2017

(54) COATING METHODS AND A COATED SUBSTRATE

(71) Applicant: GENERAL ELECTRIC COMPANY, Schenectady, NY (US)

(72) Inventors: Thomas Robert Reid, Greenville, SC (US); Paul Stephen Dimascio, Greer, SC (US); Jonathan Matthew Lomas, Simpsonville, SC (US); Cem Murat Eminoglu, Greenville, SC (US)

(73) Assignee: General Electric Company, Schenectady, NY (US)

( * ) Notice: Subject to any disclaimer, the term of this patent is extended or adjusted under 35 U.S.C. 154(b) by 320 days.

(21) Appl. No.: 14/098,599

(22) Filed: Dec. 6, 2013

(65) Prior Publication Data

US 2015/0159254 A1    Jun. 11, 2015

(51) Int. Cl.
*B05D 1/32* (2006.01)
*C23C 4/00* (2016.01)
*C23C 4/18* (2006.01)
*C23C 14/04* (2006.01)
*C23C 14/58* (2006.01)

(52) U.S. Cl.
CPC .............. *C23C 4/005* (2013.01); *B05D 1/32* (2013.01); *C23C 4/01* (2016.01); *C23C 4/134* (2016.01); *C23C 4/18* (2013.01); *C23C 14/044* (2013.01); *C23C 14/588* (2013.01); *Y10T 428/24322* (2015.01)

(58) Field of Classification Search
CPC ........ C23C 14/042; C23C 14/044; B05D 1/32
See application file for complete search history.

(56) References Cited

U.S. PATENT DOCUMENTS 3,951,701 A    4/1976  Csillag
4,743,462 A *  5/1988  Radzavich ............... C23C 4/02
                                            427/282

(Continued)

FOREIGN PATENT DOCUMENTS

EP    1350860 A1    10/2003
EP    1927677 A1     6/2008
EP    2423346 A1     2/2012

OTHER PUBLICATIONS

European Search Report issued in connection with corresponding EP Application No. 14195911A on May 6, 2015.

*Primary Examiner* — Nathan Empie
(74) *Attorney, Agent, or Firm* — McNees Wallace & Nurick LLC

(57) ABSTRACT

Coating methods and a coated substrate are provided. The coating method includes providing a component having an aperture formed in a surface thereof, arranging and disposing a hollow member on a portion of the surface to define a hollow space above the aperture corresponding to a shape of the aperture at the surface, applying at least one coating over the surface of the component and the hollow member to form an applied coating having an applied coating thickness, and removing at least a portion of the hollow member to expose the hollow space through the applied coating. The coated substrate includes a component having an aperture formed in a surface thereof, a hollow member arranged and disposed on the surface to define a hollow space above the aperture, and an applied coating over the surface of the component, the hollow space being exposed through the applied coating.

19 Claims, 8 Drawing Sheets

(56) References Cited

U.S. PATENT DOCUMENTS

| | | | |
|---|---|---|---|
| 5,540,880 A * | 7/1996 | Horiki | B05B 15/045 |
| | | | 264/553 |
| 5,902,647 A | 5/1999 | Venkataramani et al. | |
| 5,985,122 A | 11/1999 | Conner | |
| 6,234,755 B1 * | 5/2001 | Bunker | F01D 5/186 |
| | | | 416/241 R |
| 6,984,100 B2 | 1/2006 | Bunker et al. | |
| 7,004,622 B2 | 2/2006 | Hardwicke et al. | |
| 7,083,824 B2 | 8/2006 | Stankowski et al. | |
| 7,147,899 B2 | 12/2006 | Fernihough et al. | |
| 7,302,990 B2 | 12/2007 | Bunker et al. | |
| 7,351,290 B2 | 4/2008 | Rutkowski et al. | |
| 8,173,218 B2 | 5/2012 | Mase et al. | |
| 8,211,506 B2 | 7/2012 | Blankenship et al. | |
| 2004/0058070 A1 | 3/2004 | Takeuchi et al. | |
| 2011/0305583 A1 | 12/2011 | Lee et al. | |
| 2012/0052200 A1 * | 3/2012 | Zimmerman | C23C 4/005 |
| | | | 427/248.1 |
| 2013/0052344 A1 | 2/2013 | Woodard et al. | |
| 2013/0206739 A1 | 8/2013 | Reed et al. | |

* cited by examiner

COATING METHODS AND A COATED SUBSTRATE

FIELD OF THE INVENTION

The present invention is directed to coating methods and a coated substrate. More specifically, the present invention is directed to coating methods for selectively coating a substrate, and a coated substrate formed by the coating methods.

BACKGROUND OF THE INVENTION

When turbines are used on aircraft or for power generation, they are typically run at a temperature as high as possible, for increased operating efficiency. Since high temperatures can damage the alloys used for the components, a variety of approaches have been used to raise the operating temperature of the metal components. One approach calls for the incorporation of internal cooling channels in the component, through which cool air is forced during engine operation. The cooling holes can be formed in the substrate by techniques such as water jet processing and/or electrical discharge machining (EDM). Cooling air (usually provided by the engine's compressor) is fed through the holes from the cooler side to the hot side of the combustor wall. As long as the holes remain clear, the rushing air will assist in lowering the temperature of the hot metal surface and preventing melting or other degradation of the component.

Another technique for protecting the metal parts and effectively raising the practical operating temperature of an aircraft engine involves the use of a thermal barrier coating (TBC). The TBC is usually ceramic-based. TBC systems frequently also include a bond coat which is placed between the ceramic coating and the substrate to improve adhesion. The use of TBC's in conjunction with the battery of cooling holes is sometimes the most effective means for protecting an engine part. However, incorporation of both systems can be very difficult. For example, the cooling holes sometimes cannot be formed in the engine part after a TBC has been applied, since lasers usually cannot effectively penetrate both the ceramic material and the metal to form the pattern of holes. If the cooling holes are formed prior to the application of the TBC system, they may become covered and at least partially obstructed when the bond coat and/or TBC is applied. Additionally, repair of the metal parts often includes replacing the TBC, during which the existing cooling holes may become covered and at least partially obstructed. Complete removal of the ceramic-metal material from the holes can be very time-consuming and ineffective. Any obstruction of the holes during engine operation can interfere with the passage of cooling air, can waste compressor power, and can possibly lead to engine component damage due to overheating.

Therefore methods of coating a component and methods of forming apertures or holes in coated components that do not suffer from the above drawbacks are desirable in the art.

SUMMARY OF THE INVENTION

In one exemplary embodiment, a coating method includes providing a component having an aperture formed in a surface thereof, arranging and disposing a hollow member on a portion of the surface adjacent to the aperture to define a hollow space above the aperture, applying at least one coating over the surface of the component and the hollow member to form an applied coating having an applied coating thickness, and removing at least a portion of the hollow member to expose the hollow space through the applied coating. The hollow space above the aperture corresponds to a shape of the aperture at the surface.

In another exemplary embodiment, a coating method includes providing a component having at least one aperture formed in a surface thereof, arranging and disposing a hollow member over a section of the surface of the component to define a hollow space above the section, applying at least one coating over the surface of the component and the hollow member to form an applied coating having an applied coating thickness, and removing a portion of the hollow member to expose the hollow space through the applied coating.

In another exemplary embodiment, a coated substrate includes a component having an aperture formed in a surface thereof, a hollow member arranged and disposed on the surface to define a hollow space above the aperture, and an applied coating over the surface of the component. The hollow space being exposed through the applied coating.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Provided are coating methods and a coating member. Embodiments of the present disclosure, in comparison to coating methods not using one or more of the features disclosed herein, increase coating efficiency, provide apertures through a coating without post-coating clearing, increase control of airflow for coated components, decrease coating cost, decrease coating time, decreased time for cleaning apertures after coating components, or a combination thereof.

Figure 1:
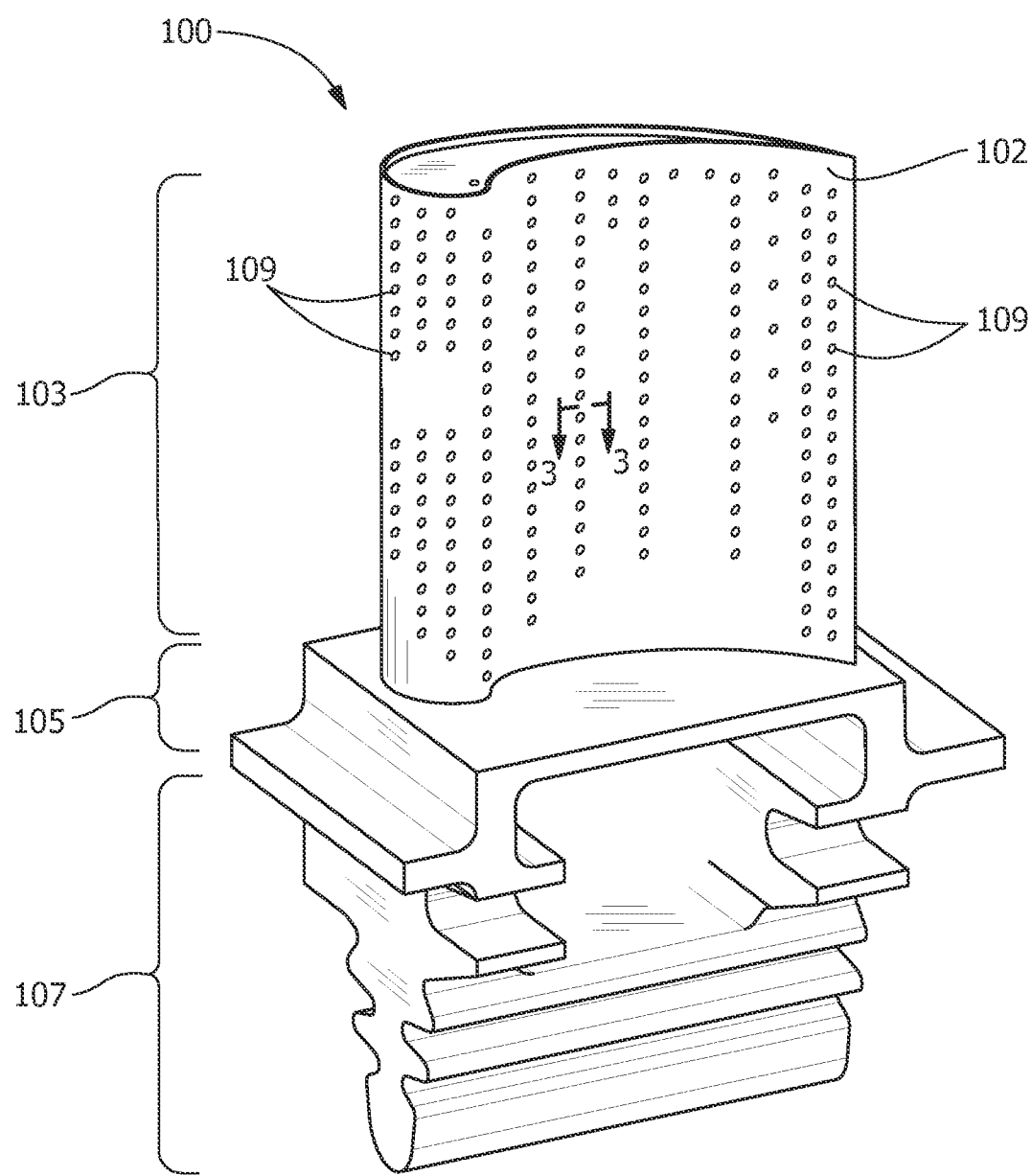
FIG. 1 shows a perspective view of a component according to an embodiment of the disclosure.
Figure 2:
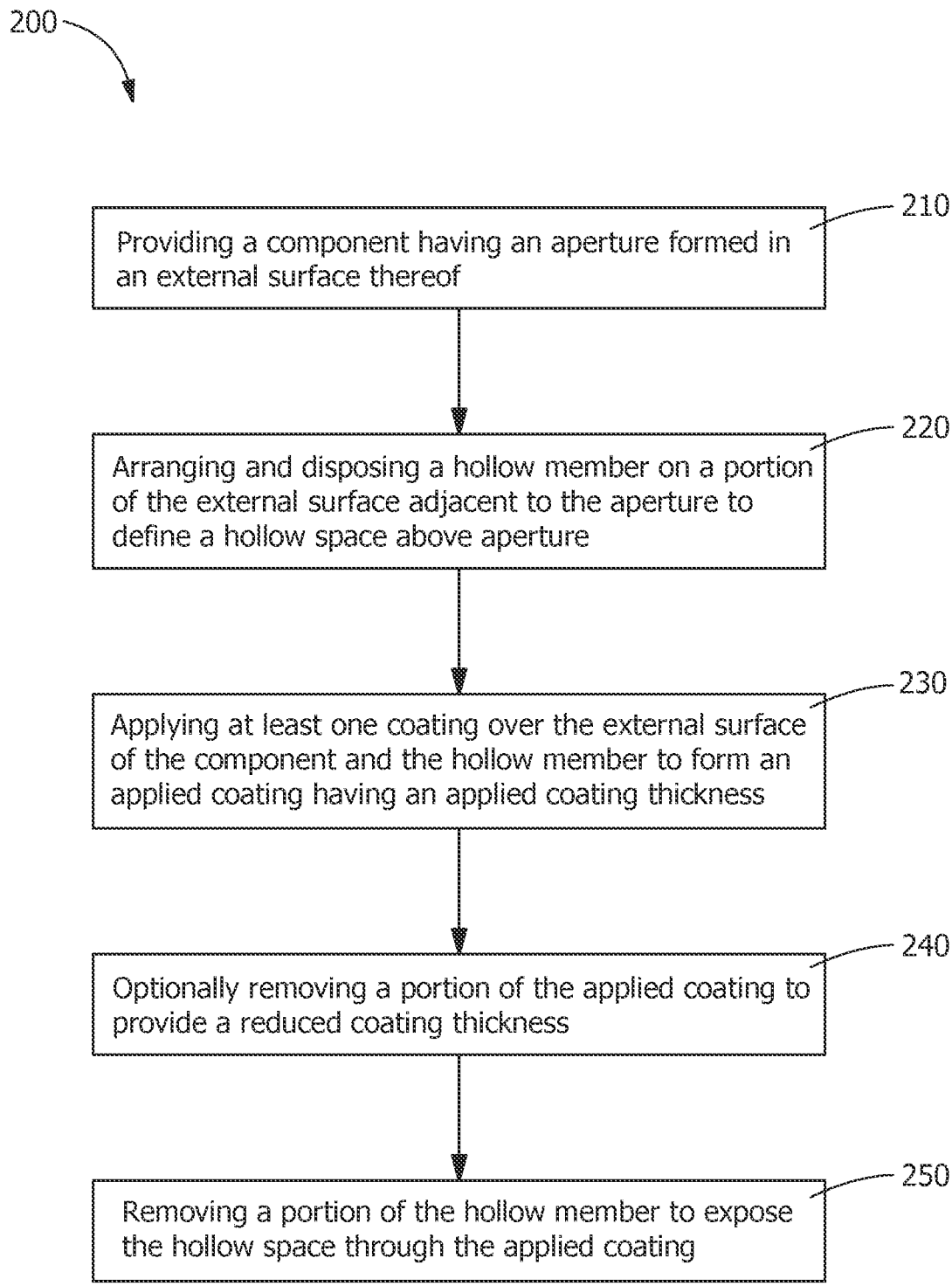
FIG. 2 is a flow chart of a coating method according to an embodiment of the disclosure.

Referring to FIG. 1, in one embodiment, a component 100 includes any suitable component having at least one aperture 109 formed therein. In another embodiment, the component 100 includes any suitable component used in applications that undergo temperature changes, such as, but not limited to, power generation systems (e.g., gas turbines, jet turbines, and other turbine assemblies). Suitable components include, but are not limited to, a nozzle, a blade, a vane, a shroud, a bucket, a transition piece, a liner, or a combination thereof. The aperture 109 includes any opening formed in an external surface 102 of the component 100, such as, but not limited to, a cooling hole (e.g., a trench cooling hole, a diffuser shape cooling hole, a straight cooling hole), an opening to provide fuel flow, or a combination thereof. For example, as shown in FIG. 1, the component 100 includes a turbine blade having an airfoil section 103, a platform section 105, and a dovetail section 107, the airfoil section 103 having a plurality of the apertures 109 functioning as cooling holes formed therein.

In one embodiment, the component 100 is fabricated from a high temperature oxidation and corrosion resistant alloy with high temperature strength, such as a nickel-based superalloy. In another embodiment, the component 100 includes an applied coating 400 (see FIG. 3) over the external surface 102. The applied coating 400 includes any suitable coating for covering at least a portion of the external surface 102 and/or providing protection (e.g., increased heat tolerance, increased corrosion resistance) to the external surface 102, such as, but not limited to, a bond coat, a thermal barrier coating (TBC), or a combination thereof. Suitable examples of the bond coat include, but are not limited to, MCrAlX coatings, where M is cobalt, nickel, iron, or combinations thereof, X is an active element, such as yttrium (Y) and/or silicon (Si) and/or at least one rare earth element or hafnium (Hf). Suitable examples of the TBC include, but are not limited to, ceramic coatings, such as zirconium oxide ($ZrO_2$) the crystalline structure of which may be partially or completely stabilized by adding yttrium oxide ($Y_2O_3$).

Referring to FIGS. 2-5, in one embodiment, a first coating method 200 includes providing the component 100 (step 210) having the aperture 109 formed in the external surface 102 thereof, then arranging and disposing a hollow member 300 (step 220) on the portion of the external surface 102 adjacent to the aperture 109 to define a hollow space 309 above the aperture 109. After the hollow member 300 is arranged and disposed (step 220), at least one coating is applied (step 230) over the external surface 102 of the component 100 and the hollow member 300 to form an applied coating 400 having an applied coating thickness 403. In one embodiment, a portion of the applied coating 400 is optionally removed (step 240) to provide the reduced coating thickness 401. Once the applied coating 400 has been formed, a portion of the hollow member 300 is removed (step 250) to expose the hollow space 309 through the applied coating 400. In an embodiment where a portion of the applied coating 400 is not removed, removing a portion of the hollow member 300 (step 250) exposes the hollow space 309 through the applied coating 400 with the applied coating thickness 403. Alternatively, when a portion of the applied coating 400 is removed (step 240), removing a portion of the hollow member 300 (step 250) exposes the hollow space 309 through the applied coating 400 with the reduced coating thickness 401.

In one embodiment, the hollow member 300 includes a geometry complementary to the aperture 109. Suitable geometries for the hollow member 300 include, but are not limited to, semi-spherical, igloo, square, rectangular, cylindrical, elliptical, hour-glass, irregular, chevron, any other geometry capable of extending from surfaces of the aperture 109 (e.g., in a planar or non-planar manner), or a combination thereof. For example, in one embodiment, the geometry of the hollow member 300 is complementary to the diffuser shape cooling hole (i.e., including a chevron geometry). In another embodiment, the geometry of the hollow member 300 is complementary to an aperture geometry of the aperture 109.

The hollow member 300 extends away from the external surface 102 of the component 100 with any suitable height for forming the hollow space 309. For example, in one embodiment, the hollow member 300 extends away from the external surface 102 of the component 100 with a height greater than or equal to the reduced coating thickness 401 (see FIG. 3 or FIG. 5). Suitable heights include, but are not limited to, up to 100 microinches greater than an applied coating thickness 403, up to 80 microinches greater than the applied coating thickness 403, up to 60 microinches greater than the applied coating thickness 403, between about 20 microinches less than and about 80 microinches greater than the applied coating thickness 403, between about 10 microinches less than and about 60 microinches greater than the applied coating thickness 403, between about 5 microinches less than and about 50 microinches greater than the applied coating thickness 403, between about 10 microinches less than and about 20 microinches greater than the applied coating thickness 403, or any combination, sub-combination, range, or sub-range thereof.

In an alternate embodiment, the height of the hollow member 300 is any suitable height less than the reduced coating thickness 401 that is also capable of providing the hollow space 309. One suitable height includes, but is not limited to, at least about 0.030 inches and less than the reduced coating thickness 401. Decreasing the height of the hollow member 300 decreases a deflection of the coating, which increases a uniformity of the applied coating 400.

The hollow member 300 is arranged and disposed (step 220) by any suitable method for providing the hollow space 309 over the aperture 109. For example, in one embodiment, arranging and disposing the hollow member 300 (step 220) includes forming the hollow member 300 on the portion of the external surface 102 adjacent to the aperture 109. The hollow member 300 is formed by any suitable forming process, such as, but not limited to, manually forming, manually applying a hollow member material 320 over a removable material 111 (e.g., with a syringe), rolling preforms into place, or through automated processes (e.g., computer controlled application, aerosol jet printing).

Figure 5:
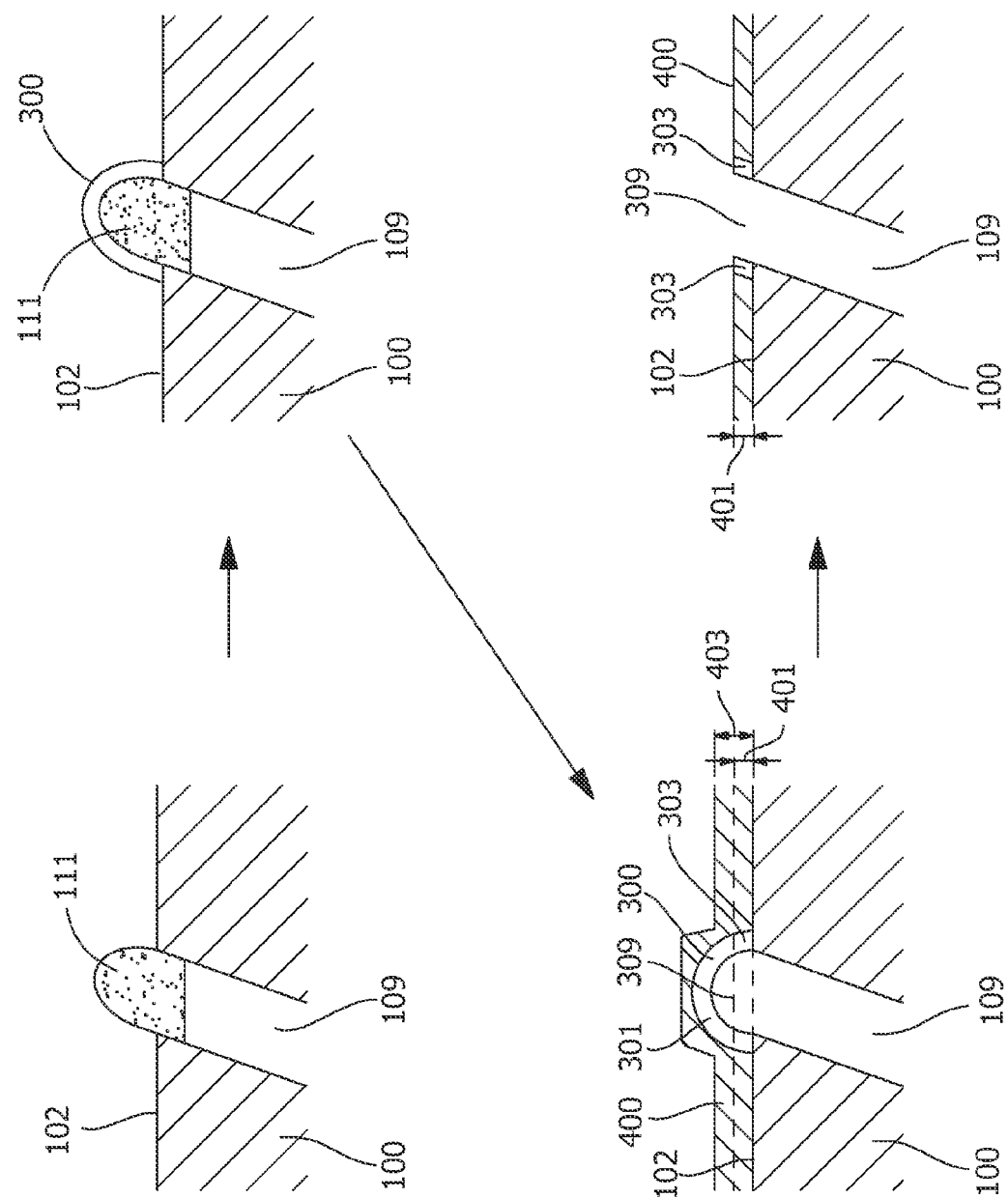
FIG. 5 shows a process view of a coating method using a removable material according to an embodiment of the disclosure.

Referring to FIG. 5, in one embodiment, to form the hollow member 300, the removable material 111 is positioned within the aperture 109 prior to arranging and disposing the hollow member 300 (step 220). The removable material 111 includes any suitable material capable of being removed during the first coating method. Suitable materials include, but are not limited to, a fugitive material, a paste, a pre-formed plug, a soluble material, a heat degradable material, a silicon putty, cotton, wax, an epoxy, or a combination thereof. At least a portion of the removable material 111 extends outwardly from the external surface 102 with a removable material geometry corresponding to the aperture geometry of the aperture 109. During the arranging and disposing of the hollow member 300 (step 220), the hollow member material 320 conforms to the removable material geometry. The hollow member material 320 is then cured to form the hollow member 300 on the portion of the external surface 102 adjacent to the aperture 109.

In an alternate embodiment, arranging and disposing the hollow member 300 (step 220) includes providing a pre-formed hollow member 310 and positioning the pre-formed hollow member 310 on the portion of the external surface 102 adjacent to the aperture 109. Positioning the pre-formed hollow member 310 includes aligning, or substantially aligning, the pre-formed hollow member 310 with the aperture 109. The pre-formed hollow member 310 is positioned by any suitable means, such as, but not limited to, manually, by a template, by an automated process, over the removable material 111, or a combination thereof. Prior to positioning, the pre-formed hollow member 310 includes either a variable configuration to permit manipulation, or a cured configuration to provide a final pre-formed shape.

Referring again to FIG. 5, in one embodiment, prior to positioning the pre-formed hollow member 310, the removable material 111 is positioned within the aperture 109. The pre-formed hollow member 310 is then positioned over the removable material 111 to facilitate aligning and/or conforming of the pre-formed hollow member 310. The pre-formed hollow member 310 including the variable configuration conforms to the removable material geometry while the pre-formed hollow member 310 including the cured configuration maintains the final pre-formed shape. After positioning, the pre-formed hollow member 310 is secured to the external surface 102 by any suitable securing method. Suitable securing methods may include heat treating, securing with adhesive, surface resistance, providing a template, or a combination thereof.

Depending on a composition of the hollow member material 320 and/or the pre-formed hollow member 310, the hollow member 300 may be cured prior to applying the at least one coating (step 230) using any suitable curing means. Suitable curing means include, but are not limited to, air drying, heating, ultra-violet radiation, or chemical curing to solidify the hollow member material 320. A suitable composition of the hollow member material 320 and/or the pre-formed hollow member 310 includes, but is not limited to, ceramic material, ceramic like material (e.g., aluminum-oxide, zirconium-oxide, hafnium-oxide, yttria stabilized zirconium-oxide and other derivatives), metallic material, silicon based material, graphite, aluminum oxide, yttria-stabilized zirconia, any other material tolerant of a coating process, or a combination thereof.

Figure 3:
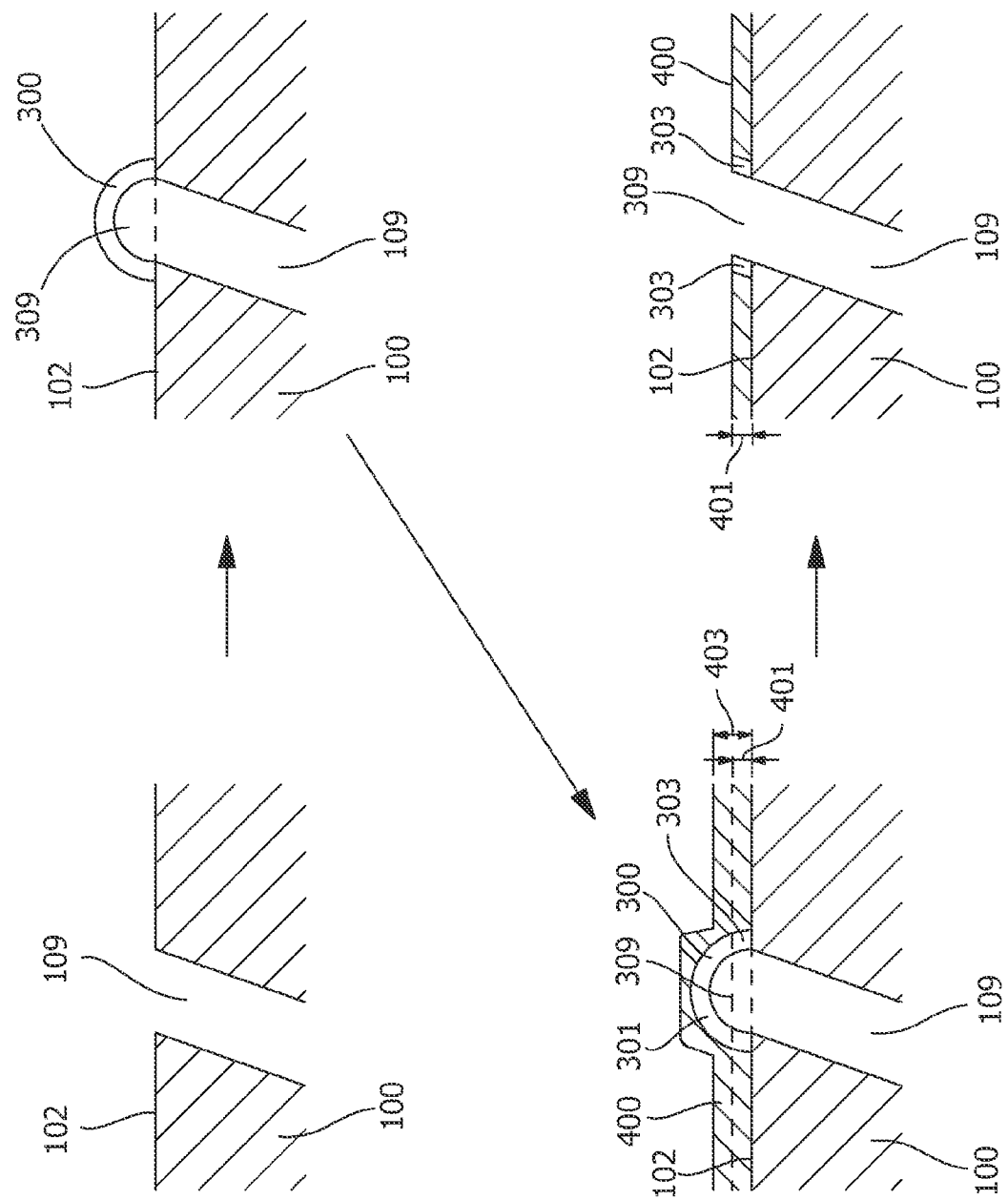
FIG. 3 shows a process view of a coating method according to an embodiment of the disclosure.
Figure 4:
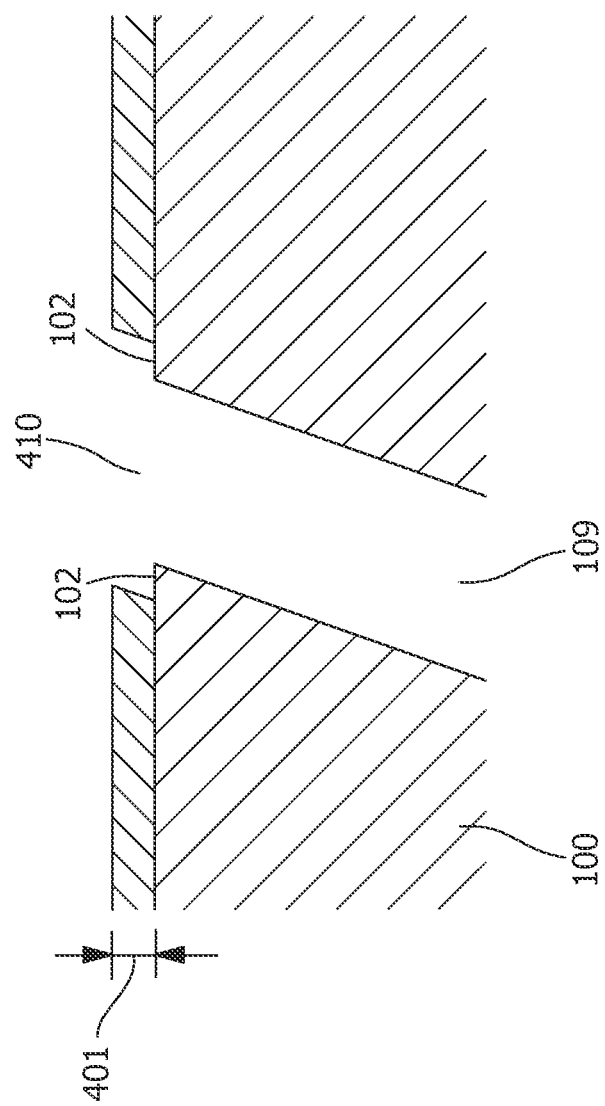
FIG. 4 shows an opening formed through an applied coating according to an embodiment of the disclosure.

Referring to FIGS. 3 and 5, after arranging and disposing the hollow member 300 (step 220), the at least one coating is applied (step 230) over the external surface 102 of the component 100 by any suitable application method for forming the applied coating 400 with the applied coating thickness 403. Suitable application methods include, but are not limited to, air plasma spray, high velocity oxygen fuel (HVOF) thermal spray, or electron beam physical vapor deposition. During the application (step 230) of the at least one coating, the hollow member 300 reduces or eliminates deposition of a coating material on or in any portion of the component below the hollow member 300 (e.g., the aperture 109, the hollow space 309, the portion of the external surface 102 where the hollow member 300 is disposed (see FIG. 4)).

Once the at least one coating has been applied (step 230), to provide the reduced coating thickness 401 a portion of the applied coating 400 is optionally removed (step 240) by any suitable coating removal method. Suitable methods include, but are not limited to, machining, sanding, etching, polishing, or a combination thereof. For example, in one embodiment, the coating removal includes polishing the applied coating 400 with a diamond pad. When the height of the hollow member 300 is greater than the reduced coating thickness 401 (see FIG. 3 or FIG. 5), removing a portion of the applied coating 400 (step 240) removes a portion of the hollow member 300. Removing a portion of the hollow member 300 includes removing either an upper portion 301, or the upper portion 301 and a lower portion 303 of the hollow member 300. In one embodiment, the upper portion 301 includes an upper geometry that differs from a lower geometry of the lower portion 303. For example, in another embodiment, the lower geometry includes a cylinder extending away from the external surface, and the upper geometry includes a semi-sphere extending away from the cylinder (e.g., a bullet shape). In another example, the hollow member 300 includes a rectangle extending away from the external surface 102 with a closed end in the upper portion 301.

When the upper portion 301 is removed without removing the lower portion 303, the lower portion 303 remains to define the hollow space 309. In one embodiment, the geometry of the hollow space 309 includes, but is not limited to, cylindrical, spherical, square, rectangular, domed, oblong, trapezoidal, curved, straight, skewed, irregular, any other shape permitting flow therethrough, or a combination thereof. When both the upper portion 301 and the lower portion 303 of the hollow member 300 are removed, the hollow space 309 is expanded to include a space previously occupied by the lower portion 303. The expanded hollow space 309 forms an opening 410 in the applied coating 400, the opening 410 corresponding to the aperture 109 and the portion of the external surface 102 adjacent to the aperture 109 (see FIG. 4). In an alternate embodiment, prior to removing a portion of the applied coating 400, a portion of the hollow member 300 is removed by mechanical bit processing, water jet processing, vibration of the component 100, or any other suitable hollow member removal method.

In an embodiment where the height of the hollow member 300 is less than the reduced coating thickness 401, at least a portion of the hollow member 300 and the applied coating 400 over the hollow member 300 are removed by any suitable method to expose the aperture 109 through the hollow space 309. One suitable method includes, but is not limited to, drilling the hollow member 300 through the applied coating 400. Another suitable method includes removing a portion of the hollow member 300 prior to removing a portion of the applied coating 400, as described above. Alternatively, in an embodiment where a portion of the applied coating 400 is not removed, depending on the height of the hollow member 300, at least a portion of the hollow member 300 is removed by any suitable method such as, but not limited to, degrading the hollow member 300, drilling the hollow member 300, any other removal method described herein, or a combination thereof.

In one embodiment, when the removable material 111 is not positioned within the aperture 109, or has been removed prior to removing a portion of the hollow member 300, the removing of a portion of the hollow member 300 exposes the hollow space 309. The exposed hollow space 309 extends the aperture 109 through the applied coating 400. Alternatively, when the removable material 111 has not been removed, removing a portion of the hollow member 300 exposes the removable material 111 within the hollow space 309. The exposed removable material 111 is then removed to clear the hollow space 309 and extend the aperture 109 through the applied coating 400 having the reduced coating thickness 401.

Suitable methods for removing the removable material 111, either before or after removing a portion of the hollow member 300, include, but are not limited to degrading the removable material 111, removing the removable material 111 with force, or a combination thereof. In one embodiment, degrading the removable material 111 includes applying a solvent, heat treating, or any other suitable degradation method based upon the composition of the removable material 111. The composition of the removable material 111 at least partially determines when during the first coating method 200 the removable material 111 is removed. For example, as a temperature tolerance of a heat degradable material decreases, the removable material 111 burns-off earlier in the first coating method 200 (e.g., securing/curing of the hollow member 300, application of the at least one coating (step 230)), when temperatures are lower as compared to later in the first coating method 200 (e.g., a post-coating heat-treatment). In one embodiment, the heat degradable material is burned-off during the application of the at least one coating (step 230), such as, but not limited to, during application of the bond coat. In another embodiment, the heat degradable material is burned-off during a pre-heating of the component 100, prior to the application of the at least one coating (step 230).

In one embodiment, prior to applying (step 230) the at least one coating, the component 100 is optionally prepared by machining, grit-blasting, sanding, etching, any other method to remove old coatings or prepare the external surface 102 of a new make component, or a combination thereof. In another embodiment, prior to preparing the component 100, a protective member is positioned over the hollow member 300. The protective member includes any suitable material for reducing or eliminating removal of the hollow member 300 during abrasive processes, such as, but not limited to, preparing the component (e.g., machining, grit-blasting, sanding, etching), high velocity oxygen fuel thermal spraying (HVOF), or a combination thereof. In one embodiment, a suitable material for the protective member includes, but is not limited to, a silicon putty. In another embodiment, the protective member includes any material having increased impact resistance as compared to the hollow member 300. After preparation, the protective member is removed by any suitable method, such as, but not limited to, during application (step 230) of the at least one coating (e.g., during a plasma spray process), during HVOF, or a combination thereof.

Figure 6:
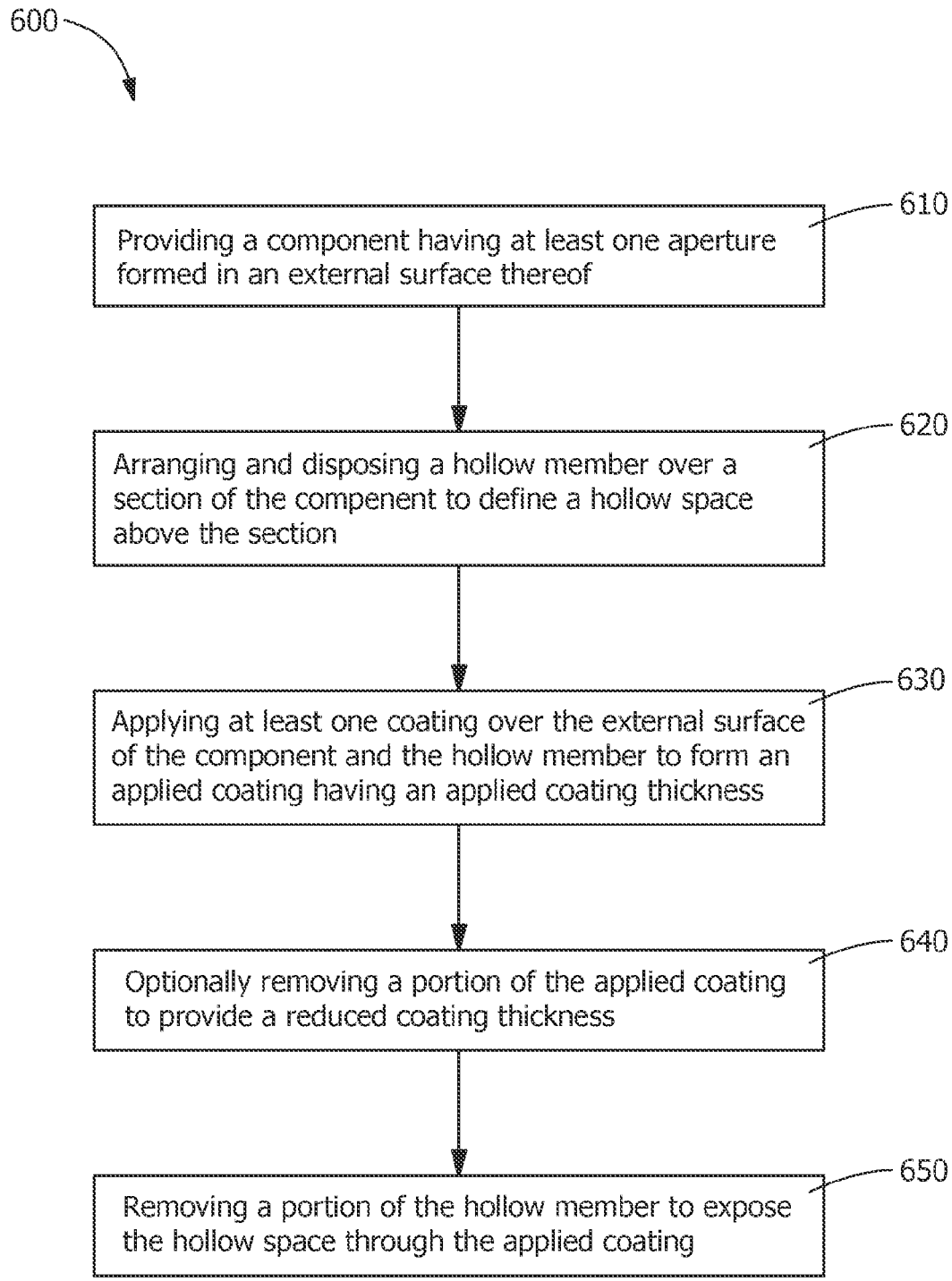
FIG. 6 is a flow chart of a coating method according to an embodiment of the disclosure.
Figure 7:
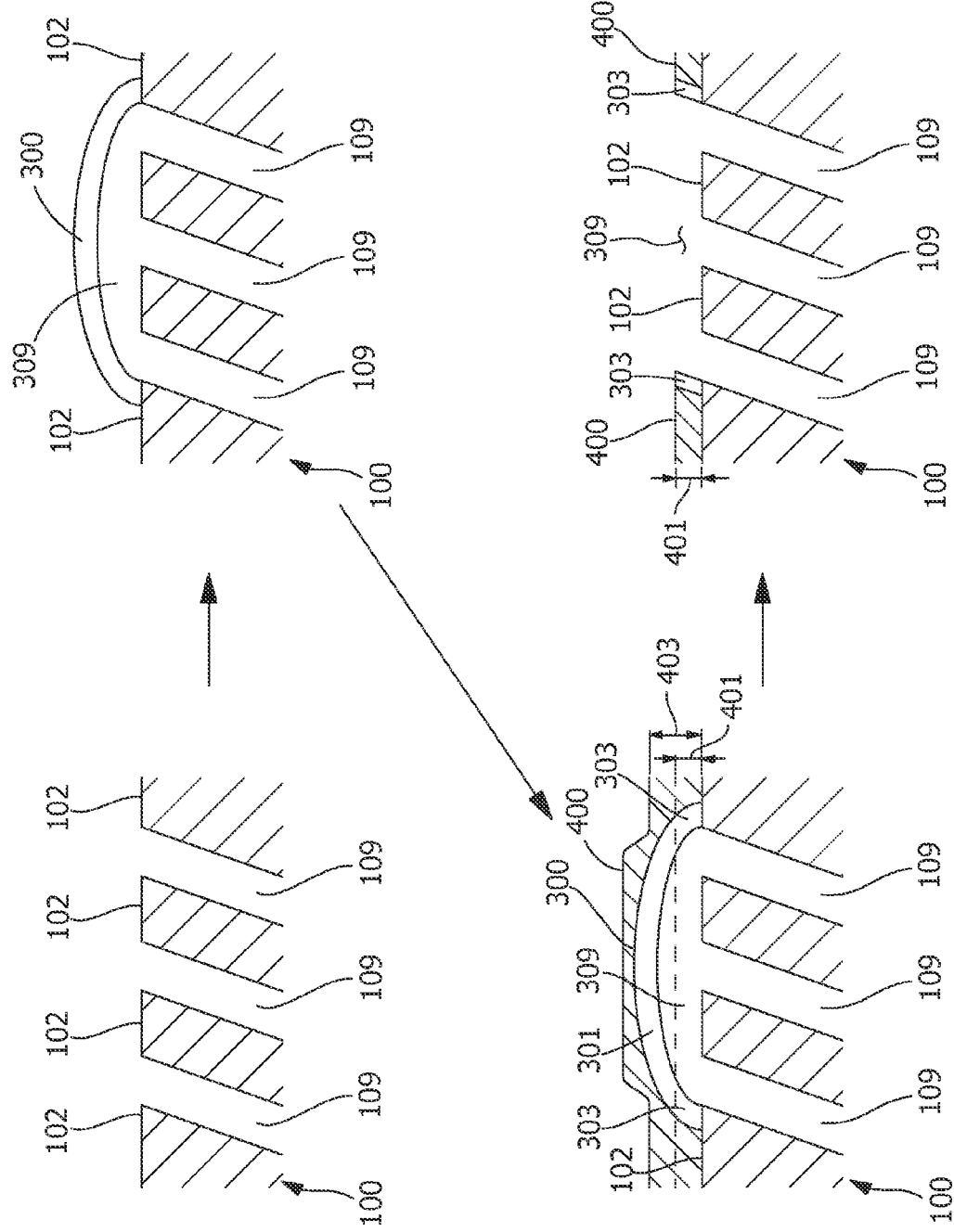
FIG. 7 shows a process view of a coating method according to an embodiment of the disclosure.
Figure 8:
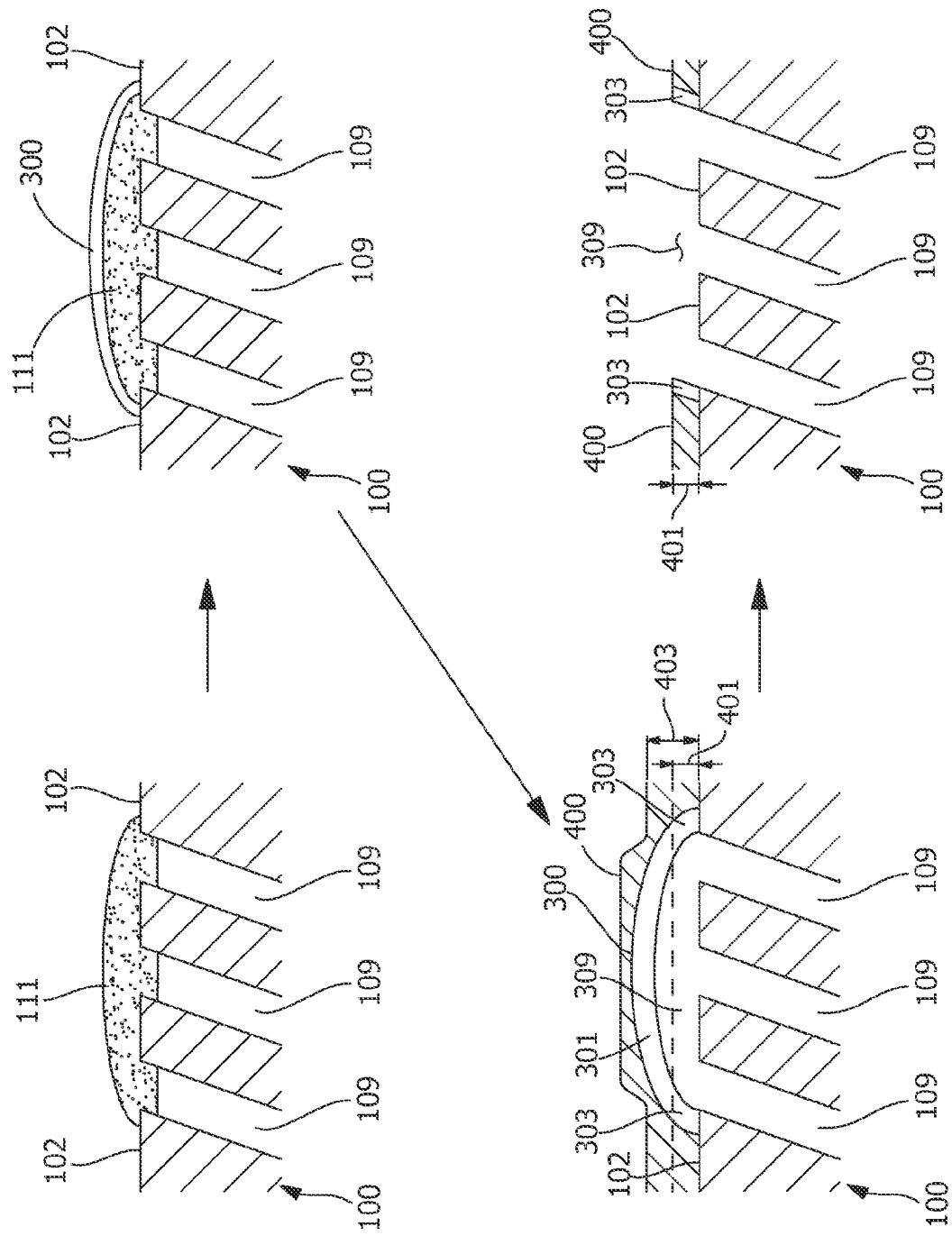
FIG. 8 shows a process view of a coating method using a removable material according to an embodiment of the disclosure.

Referring to FIGS. 6-8, in another embodiment, a second coating method 600 includes providing the component 100 having at least one aperture 109 formed in the external surface 102 thereof (step 610). The hollow member 300 is then arranged and disposed (step 620) over a section 601 of the external surface 102 of the component 100 to define the hollow space 309 above the section 601, the hollow member 300 extending away from the external surface 102 of the component 100 with any suitable height for forming the hollow space 309 (see FIGS. 7 and 8). After arranging and disposing (step 620) the hollow member 300, at least one coating is applied (step 630) over the external surface 102 of the component 100 and the hollow member 300 to form the applied coating 400 having the applied coating thickness 403. Next, a portion of the applied coating 400 is optionally removed (step 640) to provide the reduced coating thickness 401, and a portion of the hollow member 300 is removed (step 650) to expose the hollow space 309 through the applied coating 400.

Referring to FIGS. 7 and 8, in one embodiment, removing a portion of the hollow member 300 (step 650) includes removing the upper portion 301 of the hollow member 300 without removing the lower portion 303 of the hollow member 300. The lower portion 303 remains between the hollow space 309 and the applied coating 400. In another embodiment, both the upper portion 301 and the lower portion 303 of the hollow member 300 are removed to form the opening 410 in the applied coating 400 corresponding to the section 601. In a further embodiment, removing a portion of the applied coating 400 (step 640) includes removing either the upper portion 301 or the upper portion 301 and the lower portion 303 of the hollow member 300. In an alternate embodiment, the hollow member 300 is removed prior to removing a portion of the applied coating 400 by mechanical bit processing, water jet processing, vibration of the component 100, laser ablation, force (i.e., tapping the hollow member 300, for example, with a punch), or any other suitable hollow member removal method.

The section 601 of the component 100 includes, but is not limited to, any portion of the external surface 102 where the coating material is not to be deposited, at least one aperture 109, a plurality of the apertures 109, or a combination thereof. Referring to FIG. 8, in one embodiment, the removable material 111 is positioned over the section 601 prior to arranging and disposing (step 620) the hollow member 300. The removable material 111 is positioned on the section 601, and either covers the at least one aperture 109 or partially fills the at least one aperture 109. The hollow member 300 is then arranged and disposed (step 620) over the removable material 111, and the removable material 111 is subsequently removed, as described in the first coating method 200.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A coating method, comprising:
providing a component having an aperture formed in a surface thereof;
arranging and disposing a hollow member on a portion of the surface to define a hollow space above the aperture, the portion of the surface being adjacent to the aperture, the hollow member having a geometry complementary to the aperture;
applying at least one coating over the surface of the component and the hollow member to form an applied coating having an applied coating thickness; and
removing at least a portion of the hollow member to expose the hollow space through the applied coating;
wherein a lower portion of the hollow member remains to define the hollow space through the applied coating.

2. The coating method of claim 1, wherein arranging and disposing the hollow member comprises forming the hollow member or positioning a preformed hollow member.

3. The coating method of claim 1, further comprising heat treating the hollow member prior to applying the at least one coating.

4. The coating method of claim 1, further comprising selecting the hollow member from the group consisting of ceramic material, aluminum-oxide, zirconium-oxide, hafnium-oxide, yttria-stabilized zirconium-oxide, metallic material, silicon based materials, graphite, aluminum oxide, yttria-stabilized zirconia, and combinations thereof.

5. The coating method of claim 1, wherein the component is selected from the group consisting of a nozzle, a blade, a vane, a shroud, a bucket, a transition piece, a liner, and combinations thereof.

6. The coating method of claim 1, further comprising:
at least partially inserting a removable material within the aperture;
arranging and disposing the hollow member over the removable material; and
removing the removable material prior to or during application of the at least one coating.

7. The coating method of claim 1, further comprising:
positioning a protective member over the hollow member;
preparing the component prior to applying the at least one coating, the preparing selected from the group consisting of machining, grit-blasting, sanding, etching, and combinations thereof; and then
removing the protective member prior to or during a process selected from the group consisting of plasma spray and high velocity oxygen fuel spray.

8. The coating method of claim 1, further comprising removing a portion of the applied coating to provide a reduced coating thickness.

9. The coating method of claim 8, further comprising arranging the hollow member to include a height greater than or equal to the reduced coating thickness.

10. The coating method of claim 9, wherein the height of the hollow member further comprises between 10 microinches less than and 60 microinches greater than the applied coating thickness.

11. The coating method of claim 8, further comprising arranging the hollow member to include a height less than the reduced coating thickness.

12. The coating method of claim 8, wherein removing the portion of the applied coating further comprises removing the portion of the hollow member.

13. A coating method, comprising:
providing a component having an aperture formed in a surface thereof; at least partially inserting a removable material within the aperture;
arranging and disposing a hollow member over the removable material on a portion of the surface to define a hollow space above the aperture, the portion of the surface being adjacent to the aperture, the hollow member having a geometry complementary to the aperture;
applying at least one coating over the surface of the component and the hollow member to form an applied coating having an applied coating thickness;
removing at least a portion of the hollow member to expose the hollow space through the applied coating; and
removing the removable material prior to or during application of the at least one coating.

14. A coating method, comprising:
providing a component having an aperture formed in a surface thereof;
arranging and disposing a hollow member on a portion of the surface to define a hollow space above the aperture, the portion of the surface being adjacent to the aperture, the hollow member having a geometry complementary to the aperture;
positioning a protective member over the hollow member;
applying at least one coating over the surface of the component and the hollow member to form an applied coating having an applied coating thickness;
removing at least a portion of the hollow member to expose the hollow space through the applied coating;
preparing the component prior to applying the at least one coating, the preparing selected from the group consisting of machining, grit-blasting, sanding, etching, and combinations thereof; and then
removing the protective member prior to or during a process selected from the group consisting of plasma spray and high velocity oxygen fuel spray.

15. A coating method, comprising:
providing a component having at least one aperture formed in a section of a surface thereof;
positioning a removable material over the section;
arranging and disposing a hollow member over the removable material to define a hollow space above the section;
applying at least one coating over the surface of the component and the hollow member to form an applied coating having an applied coating thickness;
removing the removable material prior to or during application of the at least one coating; and
removing a portion of the hollow member to expose the hollow space through the applied coating.

16. The coating method of claim 15, wherein arranging and disposing the hollow member comprises forming the hollow member or positioning a preformed hollow member.

17. The coating method of claim 15, wherein the section of the surface of the component comprises a plurality of apertures.

18. The coating method of claim 15, wherein the removable material at least partially fills a plurality of apertures in the section of the surface of the component.

19. A coating method, comprising:
providing a component having an aperture formed in a surface thereof;
inserting a removable material at least partially within the aperture;
arranging and disposing a hollow member above the surface on a portion of the surface and over the removable material, the arranging comprising conforming the hollow member to the removable material, the portion of the surface being adjacent to the aperture, the hollow member having a geometry complementary to the aperture;
applying at least one coating over the surface of the component and the hollow member to form an applied coating having an applied coating thickness;
removing the removable material prior to or during application of the at least one coating such that the hollow member defines a hollow space above the aperture; and
removing at least a portion of the hollow member to expose the hollow space through the applied coating.

* * * * *